United States Patent [19]

Sasaki

[11] 4,320,353

[45] Mar. 16, 1982

[54] SOLID-STATE AMPLIFIER CIRCUIT FOR HIGH-FREQUENCY SIGNALS

[75] Inventor: Yutaka Sasaki, Tokyo, Japan

[73] Assignee: Nippon Electric Co., Ltd., Tokyo, Japan

[21] Appl. No.: 145,850

[22] Filed: May 1, 1980

[30] Foreign Application Priority Data

May 14, 1979 [JP] Japan .................................. 54-58907

[51] Int. Cl.³ ............................................. H03F 3/60
[52] U.S. Cl. .................................... 330/286; 330/296
[58] Field of Search ............... 330/286, 287, 296, 307, 330/53, 56

[56] References Cited

U.S. PATENT DOCUMENTS 3,869,678  3/1975  Mahoney ........................... 330/295

FOREIGN PATENT DOCUMENTS 657587  4/1979  U.S.S.R. ............................... 330/286

OTHER PUBLICATIONS

Ho et al., "Design of a 2 GHz, 50 Watt Power Amplifier Using Three-Way Combiners", May 16–18, 1977, 27th Electronic Components Conference.

Primary Examiner—James B. Mullins
Assistant Examiner—Gene Wan
Attorney, Agent, or Firm—Laff, Whitesel, Conte & Saret

[57] ABSTRACT

An improved bias circuit of the quarter-wavelength microstrip line type for a high-frequency amplifier is provided which is of divided form, including two, open and short stubs the sum of whose lengths in effect amounts to a quarter wavelength. The characteristic impedance of such microstrip line can be effectively increased by properly selecting the ratio of the stub lengths, thus enabling realization of a wider-band high-frequency amplifier circuit with reduced cost.

3 Claims, 5 Drawing Figures

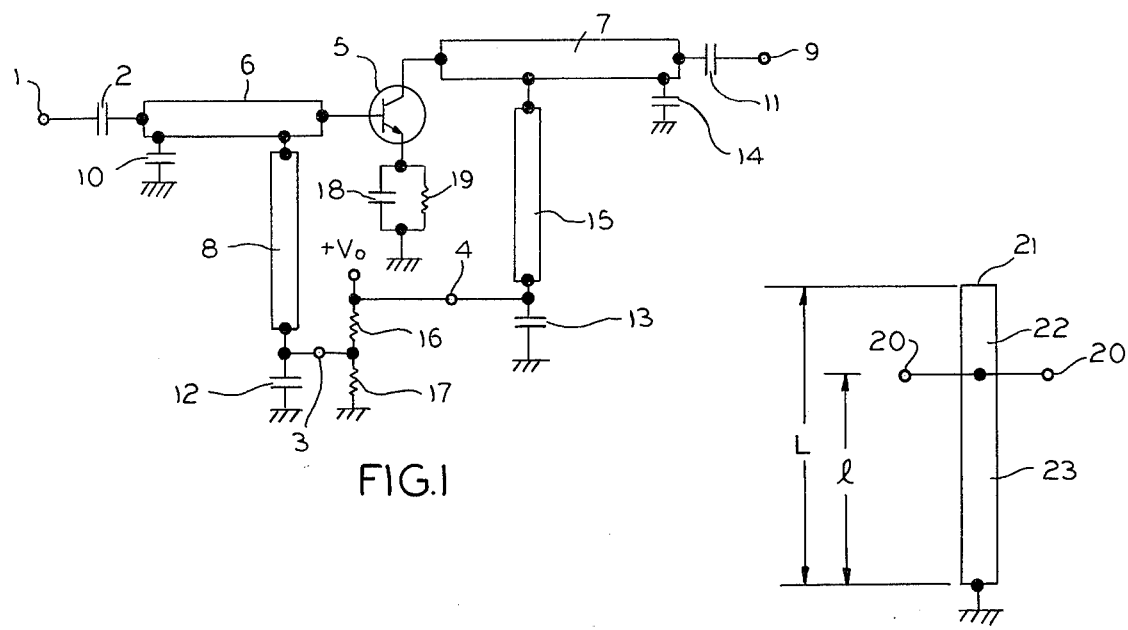
FIG.1
FIG.2
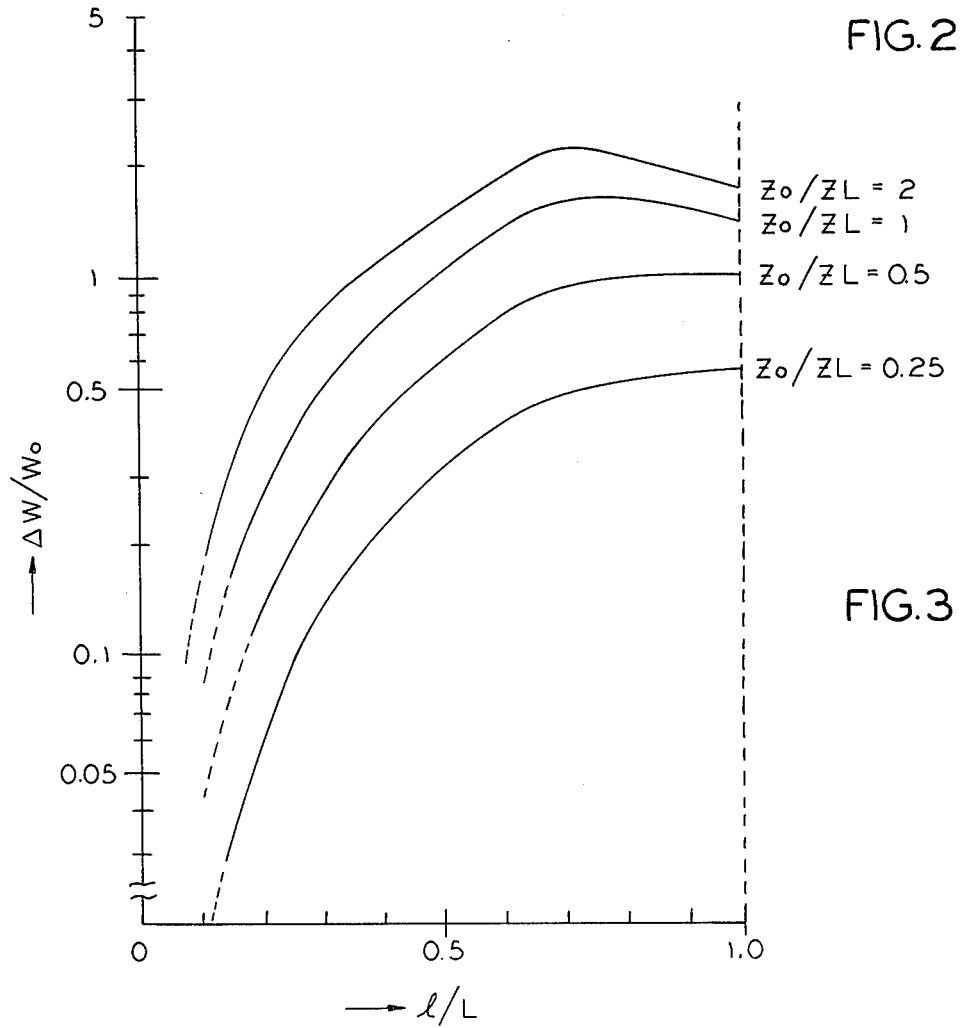
FIG.3

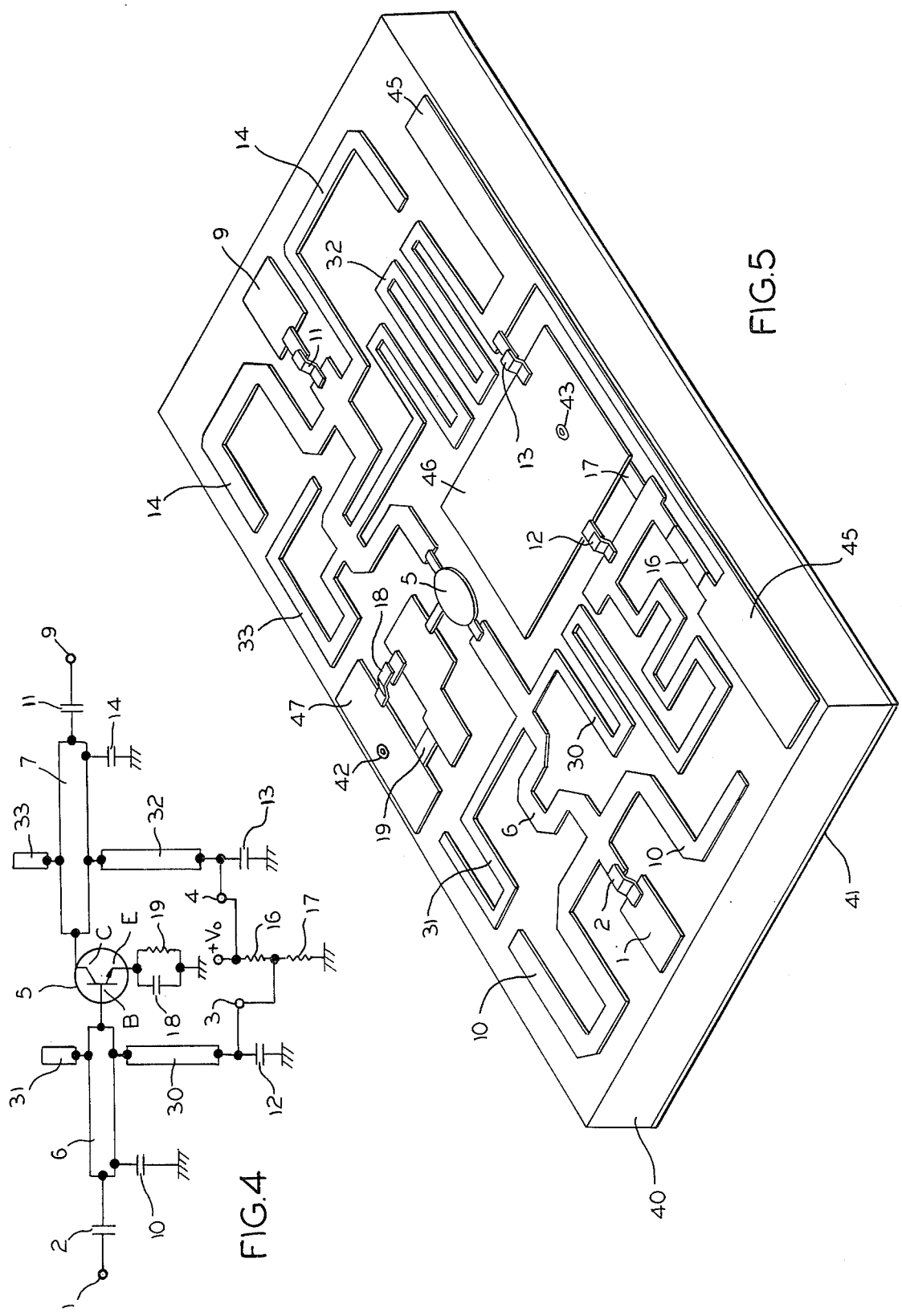

SOLID-STATE AMPLIFIER CIRCUIT FOR HIGH-FREQUENCY SIGNALS

BACKGROUND OF THE INVENTION

1. Field of the Invention

This invention relates generally to high-frequency amplifier circuits employing a transistor or the like element mounted on a substrate having microstrip lines and, more particularly to those of the type including a biasing circuit in the form of a quarter-wavelength microstrip line.

2. Description of the Prior Art

A conventional high-frequency amplifier circuit usually includes a transistor or the like amplifier element mounted on a substrate having microstrip lines, microstrip-line-type impedance matching circuits coupled, respectively, to the input and output sides of the amplifier element, and a biassing circuit. As is known, the biassing circuit is formed, for example, of such a choke coil as having no influence on the matching circuits (see U.S. Pat. No. 3,869,678) or of a line substantially of the length of a quarter wavelength having a characteristic impedance higher than the impedance of the matching circuit. A biassing circuit employing a choke coil is advantageous in that it involves only limited high-frequency and bias-current losses and enables increase in bandwidth of the circuit but is disadvantageous in that it can hardly be reduced in size as the choke coil can hardly be made of microstrip from and that it involves high cost, including many discrete components. On the other hand, a biassing circuit of the quarter-wavelength line type involves only a limited labor cost for fabrication as it can be formed efficiently on a substrate simultaneously together with a wiring pattern, matching circuits and others and, unlike the choke coil, does not necessitate any discrete components, thus enabling further reduction in cost. In cases, however, where the quarter-wavelength line is formed of a microstrip line by the inexpensive, thick-film printing technique, the width of the strip line cannot be reduced to any extreme extent thereby to increase the characteristic impedance of the line because of the manufacturing accuracy of the thick film technique or the loss of bias current involved. This means that the microstrip line has a substantial influence on the matching circuits to limit any increase in frequency range or frequency bandwidth of the amplifier circuit.

SUMMARY OF THE INVENTION

Under these circumstances, the present invention has for its object the provision of a wide-bandwidth high-frequency amplifier circuit which includes a quarter-wavelength microstrip line type biassing circuit and is free from the difficulties previously encountered as described above.

According to the present invention, there is provided a high-frequency amplifier circuit of the type including a microstrip substrate having input, output, source and earth terminals, an amplifier element mounted on the microstrip-line-bearing substrate and coupled to the input and output terminals, biassing means formed on the substrate for applying a biassing voltage to the amplifier element, characterized in that said biassing means comprise a first stub coupled to the input or output terminal, a second stub coupled at one end to the input or output terminal and means for coupling the other end of the second stub to said source terminal and that the first and second stubs are made to serve substantially as an open stub and a short stub, respectively, for the center frequency of operation of the high-frequency amplifier circuit and the sum of the lengths of the first and second stubs is substantially equal to a quarter of the wavelength at the center frequency of operation.

The above and other objects, features and advantages of the present invention will become apparent by reference to the following description when considered in connection with the accompanying drawings.

BRIEF DESCRIPTION OF THE DRAWINGS

In the drawings:

FIG. 1 diagrammatically illustrates an example of high-frequency transistor circuit including a conventional quarter-wavelength microstrip line type biassing circuit.

FIG. 2 is a diagram illustrating a quarter-wavelength microstrip line divided into an open and a short stub at the location of the signal line;

FIG. 3 is a graphical representation of the fractional 3 dB bandwidth ($\Delta\omega/\omega_0$) vs. $1/L$ characteristic of the circuit of FIG. 2;

FIG. 4 is a diagram illustrating an example of high-frequency transistor circuit including a biassing circuit embodying the principle of the present invention; and FIG. 5 is a perspective view of the high-frequency transistor circuit of FIG. 4, as mounted on a substrate.

DESCRIPTION OF THE PREFERRED EMBODIMENT

Referring to FIG. 1, reference numeral 1 indicates an input terminal; 2, an input coupling capacitor; 3, a base voltage supply terminal; 4, a collector voltage supply terminal; 5, a transistor; 6, an input impedance-matching microstrip line; 7, an output impedance-matching microstrip line; 8 and 15, quarter-wavelength microstrip lines; 9, an output terminals; 10, an input matching capacitor; 11, an output coupling capacitor; 12, 13 and 18, bypass capacitors; 14, an output matching capacitor; 16 and 17, voltage dividing resistors; and 19, an emitter resistor.

In the circuit illustrated in FIG. 1, the signal supplied to input terminal 1 is fed through capacitor 2 and microstrip line 6 to the base of transistor 5. The signal amplified at transistor 5 proceeds through strip line 7 and capacitor 11 to appear at the output terminal 9. An input matching circuit is formed of microstrip line 6 and capacitor 10; and an output matching circuit is formed of microstrip line 7 and capacitor 14. If desired, these circuits may each be formed of a microstrip line alone. The source voltage ($+V_0$) is divided by means of the resistors 16 and 17 to feed the terminal 3 while the voltage is directly applied to the terminal 4. The voltages at terminals 3 and 4 are fed to the base and the collector of transistor 5 through respective microstrip lines 8 and 15.

Generally, with a microstrip line (e.g., the one indicated at 8 or 15), its impedance Z at its one end when it is short-circuited at the other end is expressed as $$Z = Z_0 \tan\left(\frac{2\pi}{\lambda} \cdot L\right)$$

where $Z_0$ represents the characteristic impedance of the line, $\lambda$ represents the length of one wavelength on the microstrip line, L representing the length of the line. Let $L \simeq (\frac{1}{4})\lambda$. Then $Z \simeq \infty$. In other words, when the lines 8 and 15 of the length of substantially one quarter wavelength are each grounded at one end by way of capacitor 12 or 13 so as to serve as the equivalent of a short stub, they exhibit a high impedance at the other end, thus enabling voltage supply to the transistor 5 without involving any influence upon the high-frequency signal circuit arranged between the input and output terminals 1 and 9.

However, where such bias circuit is used with a wideband transistor circuit, any increase in bandwidth is hardly obtainable because of the filter characteristic of the quarter-wavelength lines 8 and 15. In coping with this difficulty, it has been usual practice to reduce the width of the quarter-wavelength lines 8 and 15 thereby to increase their characteristic impedance. There are, however, definite limits on the reduction in line width for manufacturing reasons, as described above.

Under this situation, it is contemplated to form a quarter-wavelength strip line 21 which comprises, as illustrated in FIG. 2, an open stub 22 and a short stub 23 in relation to a signal line 20.

In this formation, the susceptance $B(\omega)$ was considered in relation to the signal line 20 is expressed, in disregard of the line loss, as $$B(\omega) = \frac{1}{Z_0} \tan\left\{ \frac{2\pi}{\lambda} (L - l) \right\} - \frac{1}{Z_0} \cot\left( \frac{2\pi}{\lambda} l \right)$$

where L represents the length of strip line 21 and l, that of short stub 23.

Further, the transfer function $T(j\omega) = V_2/V_1$, where $V_1 =$ input voltage and $V_2 =$ output voltage, is expressed as $$|T(j\omega)|^2 = \frac{4}{4 + Z_L^2 B(\omega)^2}$$

where $Z_L$ represents the load impedance on the input side of transistor 5.

Obtainable from this formula is the fractional 3 dB bandwidth $\Delta\omega/\omega_0$ ($\omega_0 =$ center frequency, say, 800 MHz, $\Delta\omega = 3$ dB bandwidth) for l/L of the quarter-wavelength line 21 of FIG. 2, which shows a tendency as illustrated in the diagram of FIG. 3. That is, the fractional 3 dB bandwidth of the quarter-wavelength line 21 varies with l/L. As noted from the diagram, in the range of $Z_0/Z_L > 0.5$, it is possible to make the fractional 3 dB bandwidth of the circuit wider than that of conventional quarter-wavelength lines of the same characteristic impedance by properly changing the relative position of signal line 20. Incidentally, the bandwidth of conventional quarter-wavelength lines corresponds to the value at l/L = 1.0 in FIG. 3.

Reference will next be had to FIG. 4, which illustrates an example of high-frequency transistor circuit including a bias circuit of this invention. In FIG. 4, open stubs 31 and 33 correspond to the portion 22 of quarter-wavelength strip line 21 of FIG. 2 and short stubs 30 and 32 correspond to the portion 23 of quarter-wavelength strip line 21. That is to say, the sum of the lengths of the open stub 31 or 33 and short stub 30 or 32 amounts to a quarter wavelength. The ratio of the lengths of the open and short stubs 30–31 or 32–33 is to be selected at a value corresponding to the maximum fractional 3 dB bandwidth in the diagram of FIG. 3.

Designed in the manner described, the transistor circuit of FIG. 4 is not influenced by the bias circuit to any substantial extent, even with its increased bandwidth. Otherwise, the circuit of FIG. 4 is of quite the same structure as the circuit of FIG. 1.

Reference will next be had to FIG. 5, which illustrates the high-frequency transistor circuit as mounted on a ceramic substrate and in which those parts corresponding to the components of FIG. 4 are identified with the same reference numerals.

The ceramic substrate 40 is made of alumina and measures 14 mm in length, 22 mm in width and 0.635 mm in thickness and having a dielectric constant $\epsilon_s = 9.3$. The matching strip lines 6 and 7 have a characteristic impedance of 50 ohms and each of the open stubs 31 and 33 and short stubs 30 and 32 has a characteristic impedance of 70 ohms. Reference numeral 41 indicates a ground surface formed on the underside of the substrate 40; 42 and 43, through holes for connection with the ground surface; 45, a terminal for source voltage $+V_0$; and 46 and 47, ground patterns. As clearly seen in this figure, the open 31 (33) and short 30 (32) stubs are separated from each other by the signal line (matching strip line) 6 (7), rendering pattern arrangement of these stubs relatively free. Further, since the sum of the lengths of the open and short stubs is to amount substantially to one quarter wavelength, including the pattern width of the associated signal line 6 (7), the actual sum of the stub lengths is reducible by an amount corresponding to the pattern width of the signal line 6 (7), compared with the length of strip line 8 (15) in FIG. 1.

What is claimed is:

1. A high-frequency amplifier circuit of the type including a microstrip-line-bearing substrate having input, output, source and grounding terminals, an amplifier element mounted on the substrate and coupled to the input and output terminals thereon, and biasing means formed on the substrate for applying a biasing voltage to the amplifier element, said circuit being characterized in that said biasing means comprises a first stub coupled to at least one of said input and output terminals, a second stub coupled at one end to the same terminal to which the first stub is coupled, and means for coupling the other end of said second stub to said source terminal, said first and second stubs serving substantially as an open stub and a short stub, respectively, for the center operating frequency of said high-frequency amplifier circuit, the sum of the lengths of said first and second stubs being substantially equal to a quarter of the wavelength at said center operating frequency.

2. A high-frequency amplifier circuit of the type including a microstrip-line-bearing substrate having input, output, source and grounding terminals, an amplifier element mounted on the substrate and coupled to the input and output terminals thereon, and biasing means formed on the microstrip substrate for applying a biasing voltage to the amplifier element, said circuit being characterized in that said biasing means comprises a first stub coupled to at least one of said input and output terminals, a second stub coupled at one end to the same terminal to which the first stub is coupled, a capacitor connected between the other end of said second stub and said grounding terminal, and means for coupling said other end of said second stub and said source terminal to each other, the sum of the lengths of said first and second stub being substantially equal to a quarter of the wavelength at the center operating frequency of said high-frequency amplifier circuit.

3. A high-frequency amplifier circuit as set forth in claim 1 or 2, further comprising input impedance matching means coupled between said input terminal and the input of said amplifier element and output impedance matching means coupled between the output of said amplifier element and said output terminal.

* * * * *